(12) United States Patent
Murayama et al.

(10) Patent No.: US 7,933,148 B2
(45) Date of Patent: Apr. 26, 2011

(54) MEMORY

(75) Inventors: Yoshiki Murayama, Gifu (JP); Kouichi Yamada, Gifu (JP)

(73) Assignee: Patrenella Capital Ltd., LLC, Wilmington, DE (US)

( * ) Notice: Subject to any disclaimer, the term of this patent is extended or adjusted under 35 U.S.C. 154(b) by 0 days.

(21) Appl. No.: 12/562,724

(22) Filed: Sep. 18, 2009

(65) Prior Publication Data

US 2010/0008164 A1    Jan. 14, 2010

Related U.S. Application Data

(63) Continuation of application No. 11/353,089, filed on Feb. 14, 2006, now Pat. No. 7,593,257.

(30) Foreign Application Priority Data

Feb. 15, 2005  (JP) ................................. 2005-037017
Jan. 30, 2006  (JP) ................................. 2006-020168

(51) Int. Cl.
    *G11C 11/34*  (2006.01)
(52) U.S. Cl. .......................... 365/177; 365/149; 365/196
(58) Field of Classification Search .................. 365/177, 365/149, 196
    See application file for complete search history.

(56) References Cited

U.S. PATENT DOCUMENTS

| | | | |
|---|---|---|---|
| 4,777,625 A | 10/1988 | Sakui et al. | |
| 4,853,899 A | 8/1989 | Kitsukawa et al. | |
| 5,168,467 A | 12/1992 | Fukushi et al. | |
| 5,371,703 A * | 12/1994 | Miyamoto | 365/185.21 |
| 5,483,483 A | 1/1996 | Choi et al. | |
| 5,535,166 A * | 7/1996 | Bateman | 365/208 |
| 6,188,615 B1 | 2/2001 | Perner et al. | |
| 6,487,103 B2 | 11/2002 | Yamamoto et al. | |
| 6,661,697 B2 | 12/2003 | Yamamoto et al. | |
| 6,930,911 B2 * | 8/2005 | Ezaki et al. | 365/158 |
| 7,369,431 B2 | 5/2008 | Muraoka et al. | |
| 2001/0046154 A1 * | 11/2001 | Forbes | 365/149 |
| 2004/0223392 A1 | 11/2004 | Ikehashi | |
| 2006/0120136 A1 * | 6/2006 | Dennison et al. | 365/148 |

FOREIGN PATENT DOCUMENTS

| | | |
|---|---|---|
| JP | 07-007090 | 1/1995 |
| JP | 09-185890 | 7/1997 |
| JP | 2002-133857 | 5/2002 |

OTHER PUBLICATIONS

Japanese Office Action, for application 2006-020168, mailed Nov. 4, 2009, Japan.
Office Action, for U.S. Appl. No. 11/353,089, mailed Nov. 30, 2007.
Office Action, for U.S. Appl. No. 11/353,089, mailed Jul. 9, 2008.

(Continued)

*Primary Examiner* — Vu A Le
*Assistant Examiner* — Han Yang
(74) *Attorney, Agent, or Firm* — Schwabe, Williamson & Wyatt, P.C.

(57) ABSTRACT

A memory capable of suppressing reduction of data determination accuracy is provided. This memory includes a memory cell connected to a bit line for holding data and a bipolar transistor whose base is connected to the bit line. In data reading, the memory reads the data by amplifying a current, corresponding to the data of the memory cell, appearing on the bit line with the bipolar transistor.

21 Claims, 5 Drawing Sheets

OTHER PUBLICATIONS

Office Action, for U.S. Appl. No. 11/353,089, mailed Dec. 10, 2008.
Notice of Allowability, for U.S. Appl. No. 11/353,089, mailed May 15, 2009.
Chinese Office Action, for application 200610009230.X, mailed on Aug. 7, 2009.
Notification of Grant of Rights for Invention Patent, mailed Jul. 13, 2010, for Chinese Patent Application No. 200610009230.X, 2 pages.
Office Action for JP Patent Application 2006-020168, mailed Jul. 21, 2010, 7 pages.

* cited by examiner

MEMORY

CROSS REFERENCE TO RELATED APPLICATION

The present application is a continuation of and claims the benefit under 35 U.S.C. §120 to U.S. patent application Ser. No. 11/353,089, entitled "MEMORY," filed Feb. 14, 2006, assigned to the same assignee as the present application, and which is incorporated herein by reference in its entirety.

BACKGROUND OF THE INVENTION

1. Field of the Invention

The present invention relates to a memory, and more particularly, it relates to a memory including memory cells holding data.

2. Description of the Background Art

A ferroelectric memory including memory cells holding data is known in general, as disclosed in Japanese Patent Laying-Open No. 2002-133857, for example.

In the ferroelectric memory including memory cells disclosed in the aforementioned Japanese Patent Laying-Open No. 2002-133857, a bit line connected to each memory cell and a capacitor storing charge are connected with each other through a charge transfer transistor controlling charge transfer from the bit line to the capacitor. In data reading, the memory determines the data held in the memory cell as "H" data or "L" data on the basis of a potential generated on a first electrode of the capacitor through change, corresponding to the data held in the memory cell, transferred to the capacitor through the bit line and the charge transfer transistor.

In the ferroelectric memory disclosed in the aforementioned Japanese Patent Laying-Open No. 2002-133857, however, the difference between the quantity of charge output to the bit line when the memory cell holds "H" data and that output to the bit line when the memory cell holds "L" data is disadvantageously reduced if the quantity of charge held in the memory cell is reduced due to downsizing of the ferroelectric memory or the like. In this case, the difference between the potential generated on the first electrode of the aforementioned capacitor when the memory reads "H" data from the memory cell and that generated on the first electrode of the capacitor when the memory reads "L" data is also reduced, and hence data determination accuracy is disadvantageously reduced when the memory determines the data on the basis of the potential generated on the first electrode of the capacitor

SUMMARY OF THE INVENTION

The present invention has been proposed in order to solve the aforementioned problem, and an object of the present invention is to provide a memory capable of suppressing reduction of data determination accuracy.

In order to attain the aforementioned object, a memory according to an aspect of the present invention comprises a memory cell, connected to a bit line, holding data and a bipolar transistor whose base is connected to the bit line. The memory reads the data by amplifying a current, corresponding to the data of the memory cell, appearing on the bit line when reading the data.

The memory according to this aspect is provided with the bipolar transistor whose base is connected to the bit line for amplifying the current, corresponding to the data of the memory cell, appearing on the bit line with the bipolar transistor when reading the data as hereinabove described, whereby the difference between collector currents of the bipolar transistor generated in data reading in correspondence to "H" data and "L" data respectively can be rendered larger than the difference between currents appearing on the bit line in correspondence to "H" data and "L" data respectively when the present invention is applied to a ferroelectric memory including memory cells having ferroelectric films. Thus, when the memory determines "H" data or "L" data on the basis of a collector potential corresponding to the difference between the collector currents of the bipolar transistor in data reading, reduction of data determination accuracy can be suppressed also when the quantity of charge held in the memory is reduced. Further, the bit line is so connected to the base of the bipolar transistor that charge output from the memory cell to the bit line in data reading is attracted into the bipolar transistor from the bit line when the present invention is applied to a ferroelectric memory including memory cells having ferroelectric films, whereby the potential of the bit line can be inhibited from extreme fluctuation. Thus, memory cells (nonselected cells), other than the memory cell whose data has been read, linked to the same bit line can be inhibited from disturbance (disappearance of data resulting from polarization states) when the memory cells are constituted of ferroelectric capacitors.

Further, the memory is provided with the bipolar transistor whose base is connected to the bit line for amplifying the current, corresponding to the data of the memory cell, appearing on the bit line with the bipolar transistor when reading the data, whereby the difference between the collector currents of the bipolar transistor generated in data reading in correspondence to "H" data and "L" data respectively can be rendered larger than the difference between the currents appearing on the bit line in correspondence to "H" data and "L" data respectively when the present invention is applied to a phase-change memory (PRAM: phase-change RAM) including memory cells having phase-change films or a resistance-change memory (PRAM: resistance RAM) including memory cells having CMR films. Thus, the memory can suppress reduction of data determination accuracy also when the difference between the quantities of currents resulting from different data stored in the memory cell is reduced, by determining "H" data or "L" data on the basis of the collector potential corresponding to the difference between the collector currents of the bipolar transistor in data reading.

The memory according to the aforementioned aspect preferably further comprises a resistor having a first end connected to the collector of the bipolar transistor, and applies a positive potential to a second end of the resistor while applying a negative potential to the emitter of the bipolar transistor. According to this structure, the difference between the collector currents of the bipolar transistor corresponding to "H" data and "L" data respectively can be easily rendered larger than the difference between the currents of the bit line corresponding to "H" data and "L" data respectively with the bipolar transistor and the resistor.

The memory according to the aforementioned aspect preferably further comprises a first field-effect transistor having either the source or the drain connected to the collector of the bipolar transistor, while the data held in the memory cell preferably includes first data and second data so that the memory feeds different quantities of currents toward the collector of the bipolar transistor through the first field-effect transistor when reading the first data and when reading the second data respectively by changing the potential difference between the gate and either the source or the drain of the first field-effect transistor in response to different potentials generated on the collector of the bipolar transistor in the case of reading the first data and in the case of reading the second data respectively and reads the data on the basis of the potential of either the drain or the source of the first field-effect transistor when reading the data. According to this structure, the memory can more remarkably reduce the potential of either the drain or the source of the first field-effect transistor from a prescribed positive potential when reading "H" data as compared with the case of reading "L" data by applying the prescribed positive potential to either the drain or the source of the first field-effect transistor in advance of reading the data if the first and second data are "H" data and "L" data respectively and the memory feeds a larger quantity of current toward the collector of the bipolar transistor through the first field-effect transistor when reading "H" data as compared with the case of reading "L" data. Thus, the difference between the potentials generated on either the drain or the source of the first field-effect transistor when the memory reads "H" data and "L" data respectively can be rendered larger than the difference between the potentials generated on the collector of the bipolar transistor when the memory reads "H" data and "L" data respectively. In other words, the memory can amplify the charge, corresponding to the data of the memory cell, appearing on the bit line not only with the bipolar transistor but also with the first field-effect transistor. Thus, the memory can further suppress reduction of data determination accuracy by determining the data on the basis of the potential of either the drain or the source of the first field-effect transistor in data reading.

In the aforementioned structure including the first field-effect transistor, the memory preferably applies a prescribed first potential to the gate of the first field-effect transistor while applying a second potential generated on the collector of the bipolar transistor to either the source or the drain of the first field-effect transistor in advance of reading the data, and preferably changes the second potential on either the source or the drain of the first field-effect transistor with respect to the first potential on the gate of the first field-effect transistor for feeding different quantities of currents toward the collector of the bipolar transistor through the first field-effect transistor when reading the first data and when reading the second data respectively. According to this structure, the memory can easily feed a larger quantity of current toward the collector of the bipolar transistor through the first field-effect transistor when reading "H" data as compared with the case of reading "L" data if the first and second data are "H" data and "L" data respectively and the second potential generated on the collector of the bipolar transistor is rendered lower than that in the case of reading "L" data when the memory reads "H" data.

In this case, the first potential on the gate of the first field-effect transistor is preferably a potential obtained by comparing the second potential generated on the collector of the bipolar transistor in the case of reading the first data and the second potential generated on the collector of the bipolar transistor in the case of reading the second data with each other and adding the threshold voltage of the first field-effect transistor to the higher second potential. According to this structure, the voltages of the gate and either the source or the drain of the first field-effect transistor can be rendered lower than the threshold voltage of the first field-effect transistor whether the memory reads "H" data or "L" data if the first and second data are "H" data and "L" data respectively, for example. Thus, the first field-effect transistor can be turned on whether the memory reads "H" data or "L" data, whereby the current corresponding to "H" data or "L" data can be easily fed toward the collector of the bipolar transistor through the first field-effect transistor. If the second potential generated on the collector of the bipolar transistor is rendered lower than that in the case of reading "L" data when the memory reads "H" data, the voltages of the gate and either the source or the drain of the field-effect transistor are more increased when the memory reads "H" data, as compared with those in the case of reading "L" data. Thus, the memory can easily feed a larger quantity of current toward the collector of the bipolar transistor through the first field-effect transistor when reading "H" data, as compared with the case of reading "L" data.

In the aforementioned case of applying the second potential generated on the collector of the bipolar transistor to either the source or the drain of the first field-effect transistor, the second potential generated on the collector of the bipolar transistor at the time of reading the first data is preferably lower than the second potential generated on the collector of the bipolar transistor at the time of reading the second data. According to this structure, the memory can easily feed a larger quantity of current toward the collector of the bipolar transistor through the first field-effect transistor when reading "H" data, as compared with the case of reading "L" data.

In the aforementioned structure including the first field-effect transistor, the memory preferably further comprises a capacitor connected to either the drain or the source of the first field-effect transistor. According to this structure, the memory can easily hold the potential generated on either the drain or the source of the first field-effect transistor in data reading with the capacitor, whereby the data can be more reliably read on the basis of the potential of either the drain or the source of the first field-effect transistor. Further, the capacitor is so connected to either the drain or the source of the first field-effect transistor that the memory can hold a prescribed positive potential with the capacitor when applying the prescribed positive potential to either the drain or the source of the field-effect transistor in advance of reading the data.

In this case, the capacitor preferably holds a potential generated on either the drain or the source of the field-effect transistor at the time of reading the data. According to this structure, the memory can easily more reliably read the data on the basis of the potential of either the drain or the source of the first field-effect transistor held by the capacitor.

In the aforementioned structure including the first field-effect transistor, the memory preferably applies a positive potential to either the drain or the source of the first field-effect transistor in advance of reading the data. According to this structure, the memory can more remarkably reduce the potential of either the drain or the source of the first field-effect transistor from the positive potential when reading "H" data as compared with the case of reading "L" data if the first and second data are "H" data and "L" data respectively and the memory feeds a larger quantity of current toward the collector of the bipolar transistor through the first field-effect transistor when reading "H" data as compared with the case of reading "L" data. Thus, the difference between the potentials generated on either the drain or the source of the first field-effect transistor when the memory reads "H" data and "L" data respectively can be easily rendered larger than the difference between the potentials generated on the collector of the bipolar transistor when the memory reads "H" data and "L" data respectively.

In this case, the reduction ratio of the potential on either the drain or the source of the first field-effect transistor at the time of reading the first data is preferably larger than the reduction ratio of the potential on either the drain or the source of the first field-effect transistor at the time of reading the second data. According to this structure, the difference between the potentials generated on either the drain or the source of the first field-effect transistor when the memory reads "H" data and "L" data respectively can be more easily rendered larger than the difference between the potentials generated on the collector of the bipolar transistor when the memory reads "H" data and "L" data respectively.

In the aforementioned structure applying the positive potential to either the drain or the source of the first field-effect transistor in advance of reading the data, the memory preferably further comprises a second field-effect transistor connected to either the drain or the source of the first field-effect transistor, for applying the positive potential to either the drain or the source of the first field-effect transistor through the second field-effect transistor. According to this structure, the memory can apply the positive potential to either the drain or the source of the first field-effect transistor in advance of reading the data by controlling operations of the second field-effect transistor.

In this case, the memory preferably controls the second field-effect transistor to enter an ON-state from an OFF-state in advance of reading the data. According to this structure, the memory can easily apply the positive potential to either the drain or the source of the first field-effect transistor in advance of reading the data.

In the aforementioned structure including the first field-effect transistor, the quantity of a current flowing toward the collector of the bipolar transistor through the first field-effect transistor at the time of reading the first data is preferably larger than the quantity of a current flowing toward the collector of the bipolar transistor through the first field-effect transistor at the time of reading the second data. According to this structure, the memory can more remarkably reduce the potential of either the drain or the source of the first field-effect transistor in the case of reading "H" data as compared with the case of reading "L" data when applying the prescribed positive potential to either the drain or the source of the first field-effect transistor in advance of reading the data.

In this case, the first field-effect transistor preferably enters an ON-state weaker than an ON-state at the time of reading the first data when the memory reads the second data. According to this structure, the memory can easily increase the quantity of the current fed toward the collector of the bipolar transistor through the first field-effect transistor when reading the first data as compared with the quantity of the current fed toward the collector of the bipolar transistor through the first field-effect transistor when reading the second data.

In the aforementioned structure including the first field-effect transistor, the memory preferably further comprises a sense amplifier connected to either the drain or the source of the first field-effect transistor, for determining the data by amplifying the potential of either the drain or the source of the first field-effect transistor with the sense amplifier. According to this structure, the memory can easily read the data with the sense amplifier on the basis of the potential of either the drain or the source of the first field-effect transistor.

The memory according to the aforementioned aspect preferably further comprises a third field-effect transistor connected to the base of the bipolar transistor, while the bit line is preferably connected to the base of the bipolar transistor through the third field-effect transistor. According to this structure, the memory can supply the current appearing on the bit line toward the base of the bipolar transistor in data reading by controlling operations of the third field-effect transistor.

In this case, the memory preferably controls the third field-effect transistor to enter an ON-state from an OFF-state when reading the data. According to this structure, the memory can easily supply the current appearing on the bit line toward the base of the bipolar transistor in data reading.

In the memory according to the aforementioned aspect, the memory cell may include a ferroelectric capacitor. According to this structure, reduction of data determination accuracy can be suppressed in a ferroelectric memory including the ferroelectric capacitor.

In the memory according to the aforementioned aspect, the memory cell may include a storage element having a phase-change film. According to this structure, reduction of data determination accuracy can be suppressed in a phase-change memory including the storage element having a phase-change film.

In the memory according to the aforementioned aspect, the memory cell may include a storage element having a CMR film. According to this structure, reduction of data determination accuracy can be suppressed in a resistance-change memory including the storage element having a CMR film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The circuit structure of a ferroelectric memory according to a first embodiment of the present invention is described with reference to FIG. 1.

Figure 1:
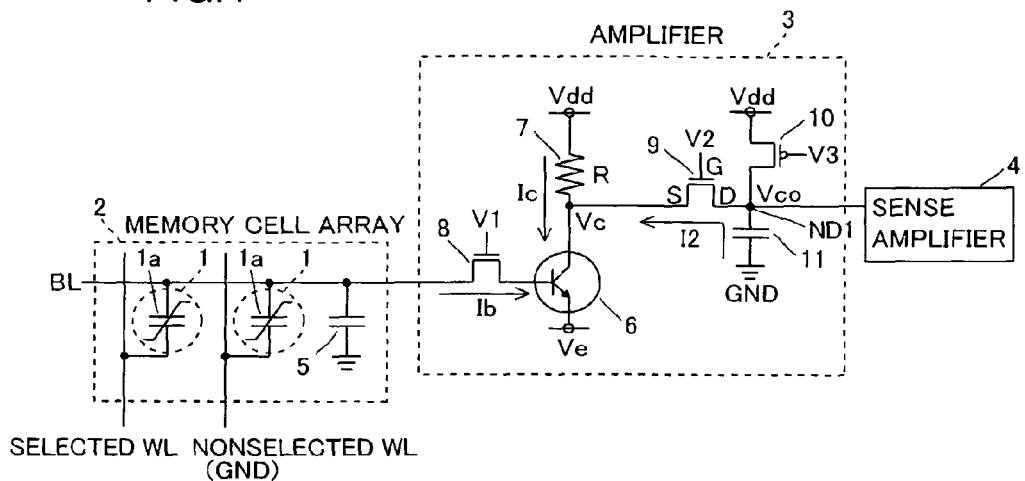
FIG. 1 is a circuit diagram showing the structure of a ferroelectric memory according to a first embodiment of the present invention.

As shown in FIG. 1, the ferroelectric memory according to the first embodiment includes a memory cell array 2 formed by a plurality of memory cells 1, an amplifier 3 and a sense amplifier 4. Each memory cell 1 is constituted of only a ferroelectric capacitor Ia arranged on a position where a word line WL and a bit line BL intersect with each other. This ferroelectric capacitor Ia is formed by arranging a ferroelectric film (no shown) between the word line WL and the bit line BL. The ferroelectric capacitor Ia holds charge of a quantity corresponding to "H" data or "L" data, so that the memory cell 1 holds the "H" data or the "L" data. The bit line BL has a parasitic capacitance 5.

The amplifier 3 has a function of amplifying the charge, corresponding to the data held in each memory cell 1, appearing on the bit line BL in data reading. This amplifier 3 is constituted of an npn bipolar transistor 6, a resistor 7, n-channel transistors 8 and 9 and a p-channel transistor 10 formed by MOS-FETs (metal oxide semiconductor field-effect transistors) and a capacitor 11. The n-channel transistors 8 and 9 are examples of the "third field-effect transistor" and the "first field-effect transistor" in the present invention respectively. The p-channel transistor 10 is an example of the "second field-effect transistor" in the present invention.

According to the first embodiment, the bit line BL is connected to the source of the n-channel transistor 8, while the drain of the n-channel transistor 8 is connected to the base of the bipolar transistor 6. In other words, the bit line BL is connected to the base of the bipolar transistor 6 through the n-channel transistor 8 according to the first embodiment. Thus, the bipolar transistor 6 amplifies a current appearing on the bit line BL in data reading. More specifically, the current appearing on the bit line BL in data reading flows toward the emitter of the bipolar transistor 6 as a base current Ib through the bases of the n-channel transistor 8 and the bipolar transistor 6. In response to this flow of the base current Ib, a collector current Ic obtained by amplifying the base current Ib with the bipolar transistor 6 flows from the collector toward the emitter of the bipolar transistor 6.

According to the first embodiment, a first end of the resistor 7 is connected to the collector of the bipolar transistor 6. A positive potential Vdd is applied to a second end of the resistor 7, while a prescribed negative potential Ve is applied to the emitter of the bipolar transistor 6. According to the first embodiment, the source of the n-channel transistor 9 is connected to the collector of the bipolar transistor 6. The sense amplifier 4 is connected to the drain of the n-channel transistor 9. The drain of the p-channel transistor 10 is connected to a node ND1 between the drain of the n-channel transistor 9 and the sense amplifier 4. The positive potential Vdd is applied also to the source of the p-channel transistor 10. According to the first embodiment, a first electrode of the capacitor 11 is connected to the node ND1, while a second electrode thereof is grounded.

A data read operation of the ferroelectric memory according to the first embodiment is described with reference to FIGS. 1 to 5.

Figure 2:
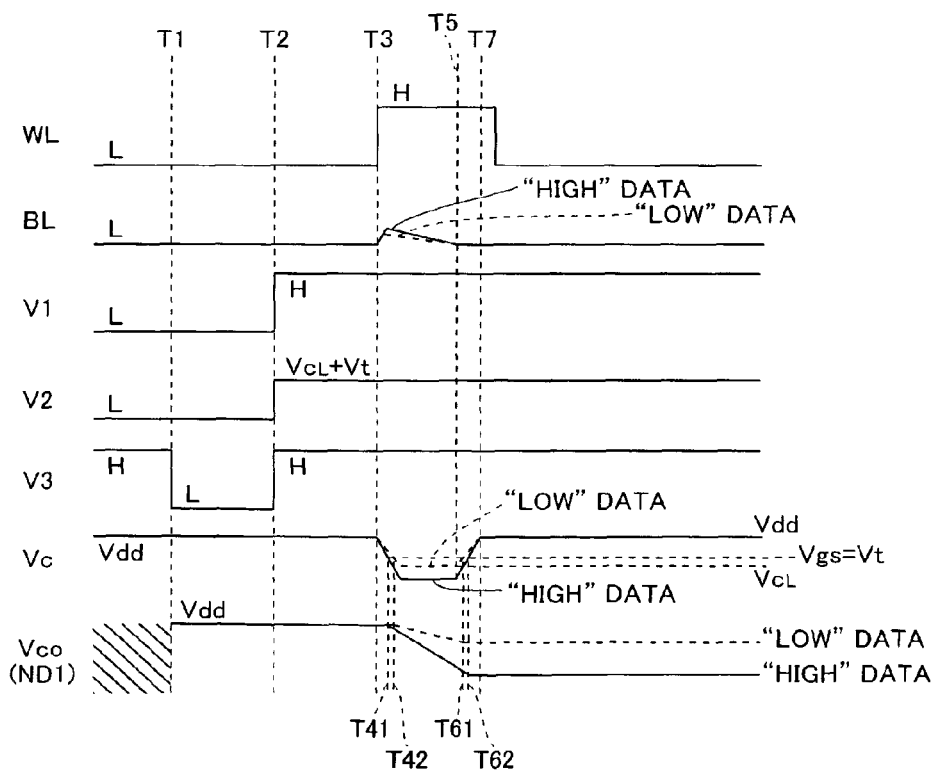
FIG. 2 is a voltage waveform diagram for illustrating a data read operation of the ferroelectric memory according to the first embodiment of the present invention.

In an initial state of the data read operation of the ferroelectric memory according to the first embodiment, the potentials of every word line WL and every bit line BL are at a low level (GND), as shown in FIG. 2. In this initial state, both of potentials V1 and V2 input in the gates of the n-channel transistors 8 and 9 respectively are at low levels. Thus, both of the n-channel transistors 8 and 9 are in OFF-states. A potential V3 input in the gate of the p-channel transistor 10 is at a high level. Thus, the p-channel transistor 10 is in an OFF-state. The node ND1 is in a floating state due to the OFF-states of the n-channel transistor 9 and the p-channel transistor 10.

Figure 3:
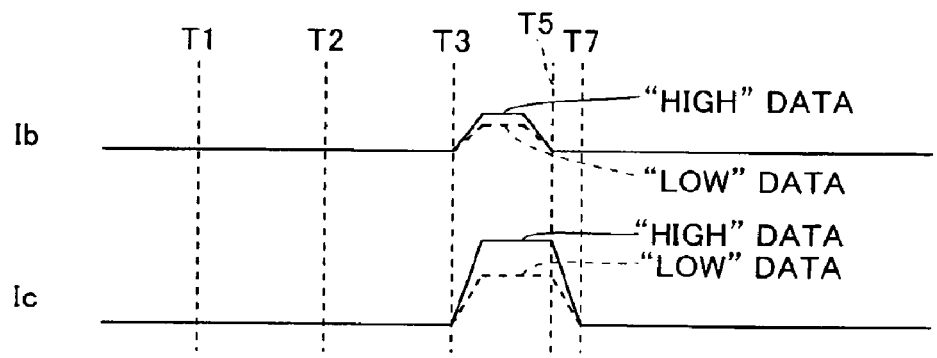
FIG. 3 is a waveform diagram showing changes of a base current Ib and a collector current Ic of a bipolar transistor in the data read operation of the ferroelectric memory according to the first embodiment of the present invention.

In the initial state, further, no base current Ib flows in the bipolar transistor 6 as shown in FIG. 3, whereby no collector current Ic flows either. Thus, a collector potential Vc of the bipolar transistor 6 is at a positive level Vdd, as shown in FIG. 2.

At a time T1, the potential V3 input in the gate of the p-channel transistor 10 goes down from the high level to a low level. Thus, the ferroelectric memory turns on the p-channel transistor 10, thereby supplying the positive potential Vdd to the node ND1 through the p-channel transistor 10. Therefore, the ferroelectric memory precharges the node ND1 to the positive potential Vdd. At a time T2, the potential V3 input in the gate of the p-channel transistor 10 goes up to a high level from the low level. Thus, the ferroelectric memory turns off the p-channel transistor 10, whereby the node ND1 enters a floating state while holding the positive potential Vdd.

At the time T2, the potential V1 input in the gate of the n-channel transistor 8 goes up from the low level to a high level. Thus, the ferroelectric memory turns on the n-channel transistor 8. At the time T2, further, the potential V2 input in the gate of the n-channel transistor 9 goes up from the low level to $V_{CL}+Vt$, where $V_{CL}$ denotes the minimum value of the potential Vc generated on the collector of the bipolar transistor 6 in a period between the time T3 and a time T7 described later when the ferroelectric memory reads "L" data from the memory cell 1. Vt denotes the threshold voltage of the n-channel transistor 9. Also when the potential V2 of the gate of the n-channel transistor 9 goes up to $V_{CL}+Vt$, the gate-to-source voltage $V_{GS}$ (=V2−Vc) of the n-channel transistor 9 is held smaller than the threshold voltage Vt thereof since the collector potential Vc serving as the source potential of the n-channel transistor 9 is at Vdd at the time T2. Thus, the ferroelectric memory holds the n-channel transistor 9 in the OFF-state.

At the time T3, the potential of a prescribed word line (selected word line) WL selected from a plurality of word lines WL of the memory cell array 2 goes up from the low level to a high level. Thus, the ferroelectric capacitor 1a of the memory cell (selected cell) 1 linked to the selected word line WL outputs positive charge corresponding to the data held in this memory cell 1 to the bit line BL. When the ferroelectric memory reads "H" data from the memory cell 1, the ferroelectric capacitor 1a outputs a larger quantity of positive charge to the bit line BL as compared with a case of reading "L" data.

The potential of the bit line BL goes up as shown in FIG. 2, due to the positive charge received from the memory cell 1. When the ferroelectric memory reads "H" data from the memory cell 1, the potential of the bit line BL more remarkably goes up as compared with that in the case of reading "L" data. Then, the base current Ib flows from the bit line BL toward the emitter of the bipolar transistor 6 through the bases of the n-channel transistor 8 and the bipolar transistor 6, as shown in FIG. 3. When the ferroelectric memory reads "H" data from the memory cell 1, a larger quantity of base current Ib flows as compared with the case of reading "L" data.

At this time, the aforementioned positive charge output from the ferroelectric capacitor 1a to the bit line BL entirely flows from the base toward the emitter of the bipolar transistor 6 according to the first embodiment, whereby the potential of the bit line BL temporarily slightly goes up and thereafter goes down to the original low level (GND). Thus, the ferroelectric memory according to the first embodiment inhibits the potential of the bit line BL from remarkably fluctuating from the low level (GND) when reading the data.

When the base current Ib of the bipolar transistor 6 starts to flow at the time T3, the collector current Ic amplified due to the function of the bipolar transistor 6 transiently flows as shown in FIG. 3 according to the first embodiment. When the ferroelectric memory reads "H" data from the memory cell 1, a larger quantity of collector current Ic flows as compared with the case of reading "L" data. Following this flow of the collector current Ic, the collector potential Vc of the bipolar transistor Vc goes down from Vdd, as shown in FIG. 2. This collector potential Vc more remarkably goes down when the ferroelectric memory reads "H" data from the memory cell 1, as compared with the case of reading "L" data.

The n-channel transistor 9 enters an ON-state when the gate-to-source voltage $V_{GS}$ (=V2−Vc) thereof reaches the threshold voltage Vt (a time T41 if the ferroelectric memory reads "H" data, or a time T42 if the ferroelectric memory reads "L" data) while the collector potential Vc goes down from Vdd. Thus, a current I2 (see FIG. 1) flows from the capacitor 11 toward the collector of the bipolar transistor 6 through the n-channel transistor 9 after the time T41 or T42. Following this, the potential Vco of the node ND1 gradually goes down from Vdd, as shown in FIG. 2.

According to the first embodiment, the collector potential Vc more remarkably goes down when the ferroelectric memory reads "H" data as compared with the case of reading "L" data, thereby increasing the gate-to-source voltage $V_{GS}$ of the n-channel transistor 9. Thus, a larger quantity of current I2 flows through the n-channel transistor 9 when the ferroelectric memory reads "H" data, as compared with the case of reading "L" data. In other words, the n-channel transistor 9 enters a weak ON-state close to an OFF-state to feed only a small quantity of current when the ferroelectric memory reads "L" data, while the n-channel transistor 9 enters a stronger ON-state to feed a relatively large quantity of current when the ferroelectric memory reads "H" data. Thus, the potential Vco of the node ND1 more remarkably goes down from VDD when the ferroelectric memory reads "H" data, as compared with the case of reading "L" data. According to the first embodiment, therefore, the difference between the potentials generated on the node ND1 when the ferroelectric memory reads "H" data and "L" data respectively is larger than the difference between the collector potentials Vc of the bipolar transistor 6 generated when the ferroelectric memory reads "H" data and "L" data respectively.

At a time T5, the positive charge output from the ferroelectric capacitor 1a of the memory cell 1 to the bit line BL entirely flows toward the emitter of the bipolar transistor 6 (base current Ib=0) as shown in FIG. 3, while the potential of the bit line BL goes down to a low level (GND) as show in FIG. 2. Thereafter the quantity of the collector current Ic is reduced as shown in FIG. 3. Following this, the collector potential Vc of the bipolar transistor 6 goes up as shown in FIG. 2. The n-channel transistor 9 enters an OFF-state after the gate-to-source voltage $V_{GS}$ (=V2−Vc) thereof reaches the threshold voltage Vt (a time T61 if the ferroelectric memory reads "L" data, or a time T62 if the ferroelectric memory reads "H" data) while the collector potential Vc goes up. Thus, no current I2 flows from the capacitor 11 toward the collector of the bipolar transistor 6 through the n-channel transistor 9 after the time T61 or T62. Therefore, the potential Vco of the node ND1 stops going down.

According to the first embodiment, the capacitor 11 holds the potential Vco of the node ND1 at the time of stopping going down (the time T61 if the ferroelectric memory reads "L" data, or the time T62 if the ferroelectric memory reads "H" data). Thereafter the quantity of the collector current Ic flowing in the bipolar transistor 6 is reduced and the collector potential Vc goes up to Vdd up to the time T7.

Figure 4:
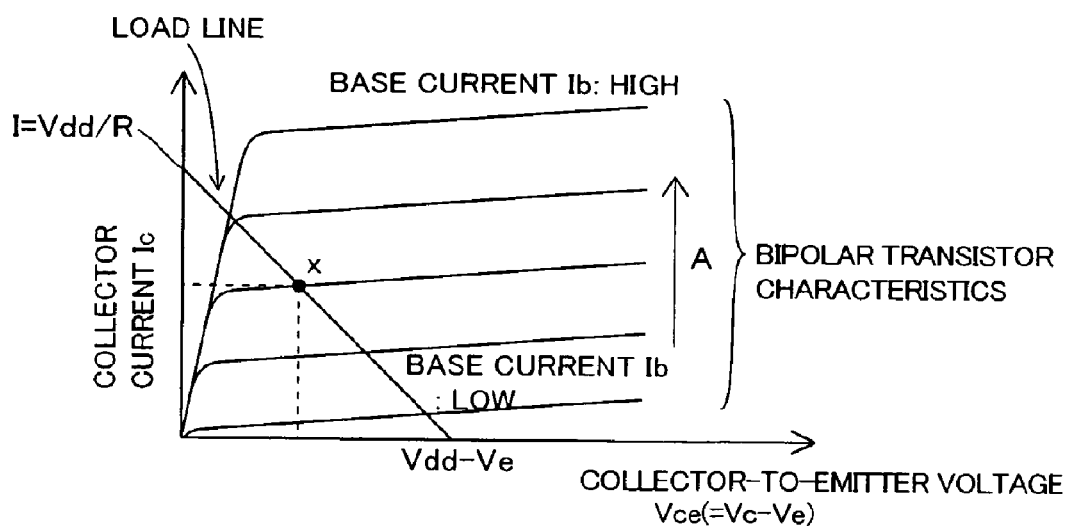
FIG. 4 illustrates the relation between a load line and bipolar transistor characteristics in the ferroelectric memory according to the first embodiment of the present invention.

In the aforementioned period between the times T3 and T7, the ferroelectric memory decides the collector potential Vc of the bipolar transistor 6 from the value of the currently flowing base current Ib through the relation between bipolar transistor characteristics and a load line shown in FIG. 4. In other words, curves showing the characteristics of the bipolar transistor 6 change in a direction for increasing the collector current Ic along arrow A in FIG. 4, in correspondence to increase of the base current Ib flowing in the bipolar transistor 6. The ferroelectric memory decides the values of the collector current Ic and the collector-emitter voltage Vce (Vc−Ve) at the time of feeding a prescribed base current Ib from the intersection (x, for example) between the curve showing the characteristic of the bipolar transistor 6 corresponding to the prescribed base current Ib and the load line. The ferroelectric memory decides the collector potential Vc by deciding the collector-to-emitter voltage Vce.

Figure 5:
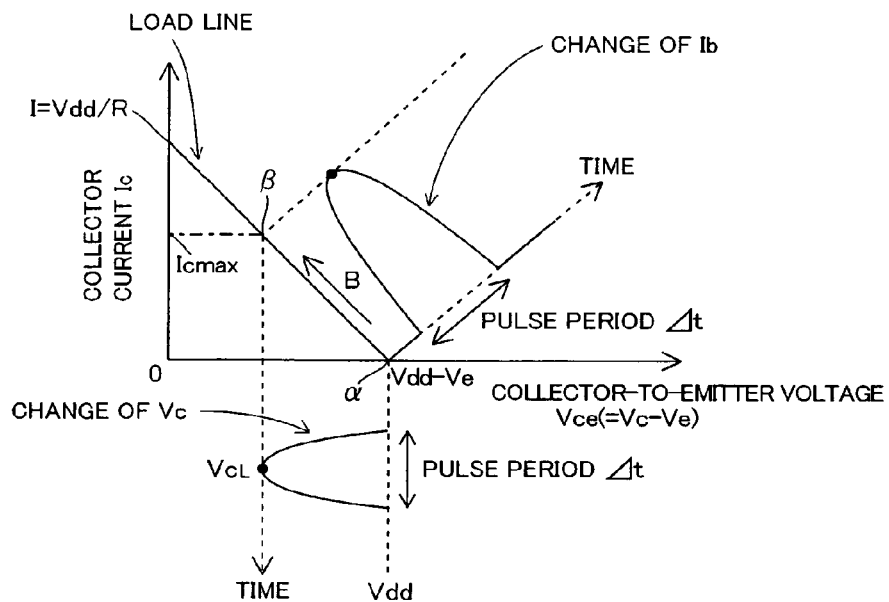
FIG. 5 illustrates the relation between the base current Ib, the collector current Ic and a collector potential Vc of the bipolar transistor of the ferroelectric memory according to the first embodiment of the present invention.

According to the first embodiment, the change of the base current Ib of the bipolar transistor 6 exhibits a pulse waveform as shown in FIG. 5. Thus, the ferroelectric memory decides the collector current Ic and the collector-to-emitter voltage Vce corresponding to a prescribed point of the load line corresponding to the pulse waveform of the base current Ib from the prescribed point. More specifically, a base current Ib of zero corresponds to a point a on the load line shown in FIG. 5. At this time, the collector current Ic is also zero. At this time further, the collector-to-emitter voltage Vce reaches Vdd−Ve, whereby the collector potential Vc reaches Vdd. As the base current Ib is increased, the point of the load line corresponding to the base current Ib moves along arrow B in FIG. 5. The collector current Ic is increased following this. At this time, the collector-to-emitter voltage Vce is reduced, whereby the collector potential Vc goes down from Vdd. On the other hand, the maximum base current Ib corresponds to another point .beta. of the load line shown in FIG. 5. At this time, the collector current Ic flowing in the bipolar transistor 6 reaches the maximum value (Icmax). At this time, further, the collector-to-emitter voltage Vce reaches the minimum value, whereby the collector potential Vc goes down to the lowest value $V_{CL}$. Thereafter the base current Ib is reduced to zero, whereby the collector current Ic is also reduced to zero. At this time, the collector-to-emitter voltage Vce is increased to Vdd−Ve, whereby the collector potential Vc goes up from $V_{CL}$ to Vdd.

After the time T7, the sense amplifier 4 compares the potential Vco of the node ND1 with a prescribed reference potential. The reference potential is set to a level between the potentials Vco generated on the node ND1 when the ferroelectric memory reads "H" data and "L" data respectively. The sense amplifier 4 further amplifies the difference between the potential Vco of the node ND1 and the reference potential, and determines the data read from the memory cell 1 as "H" data or "L" data. After the time T7, further, the potential of the word line WL falls from the high level to a low level. Since the positive charge held in the ferroelectric capacitor 1a of the memory cell 1 has been entirely output to the bit line BL at the aforementioned time T5, the potential of the word line WL may fall at any timing after the time T5. The ferroelectric memory according to the first embodiment reads the data in the aforementioned manner.

According to the first embodiment, as hereinabove described, the ferroelectric memory is provided with the bipolar transistor 6 whose base is connected to the bit line BL for amplifying the current, corresponding to the data of the memory cell 1, appearing on the bit line BL with the bipolar transistor 6 in data reading, whereby the difference between the collector currents Ic of the bipolar transistor 6 generated in data reading in correspondence to "H" data and "L" data respectively can be rendered larger than the difference between the currents (base currents Ib) appearing on the bit line BL in correspondence to "H" data and "L" data respectively. According to the first embodiment, further, the first end of the resistor 7 is connected to the collector of the bipolar transistor 6 while the ferroelectric memory applies the positive potential Vdd and the negative potential Ve to the second end of the resistor 7 and the emitter of the bipolar transistor 6 respectively, whereby the difference between the collector currents Ic in the case of reading "H" data and "L" data respectively can be rendered larger than the difference between the currents of the bit line BL corresponding to "H" data and "L" data respectively.

According to the first embodiment, the source of the n-channel transistor 9 is connected to the collector of the bipolar transistor 6 while the ferroelectric memory more increases the gate-to-source voltage $V_{GS}$ of the n-channel transistor 9 in response to more remarkable reduction of the collector potential Vc of the bipolar transistor 6 when reading "H" data as compared with the case of reading "L" data thereby feeding a larger quantity of current I2 toward the collector of the bipolar transistor 6 through the n-channel transistor 9, whereby the potential Vco of the node ND1 linked to the drain of the n-channel transistor 9 can more remarkably go down from the positive potential Vdd when the ferroelectric memory reads "H" data as compared with the case of reading "L" data. Thus, the difference between the potentials Vco generated on the node ND1 when the ferroelectric memory reads "H" data and "L" data respectively can be rendered larger than the difference between the collector potentials Vc of the bipolar transistor 6 in the cases of reading "H" data and "L" data respectively. In other words, the ferroelectric memory can amplify the charge, corresponding to the data of the memory cell 1, appearing on the bit line BL not only with the bipolar transistor 6 but also with the n-channel transistor 9. Thus, the ferroelectric memory can suppress reduction of data determination accuracy by determining the data with the sense amplifier 4 on the basis of the potential Vco of the node ND1, also when the quantity of the charge held in the ferroelectric capacitor 1a of the memory cell 1 is reduced.

According to the first embodiment, the bit line BL is so connected to the base of the bipolar transistor 6 that the positive charge output from the memory cell 1 to the bit line BL in data reading flows from the bit line BL toward the emitter of the bipolar transistor 6, whereby the potential of the bit line BL can be inhibited from extreme fluctuation. Thus, the ferroelectric capacitor 1a of the memory cell (nonselected cell) 1, other than the memory cell 1 whose data has been read, linked to the same bit line BL can be inhibited from disturbance (disappearance of data resulting from a polarization state).

According to the first embodiment, the capacitor 11 connected to the drain of the n-channel transistor 9 (node ND1) can hold the potential Vco of the node ND1 after the time T61 or T62 in data reading. Thus, the ferroelectric memory can thereafter reliably determine whether the data read from the memory cell 1 is "H" data or "L" data with the sense amplifier 4 on the basis of the potential Vco of the node ND1. Further, the capacitor 11 connected to the drain of the n-channel transistor 9 (node ND1) can hold the positive potential Vdd applied to the node ND1 when the ferroelectric memory applies the positive potential Vdd to the node ND1 in the period between the times T1 and T2 in advance of data reading.

According to the first embodiment, as hereinabove described, the p-channel transistor 10 is connected to the node ND1 so that the ferroelectric memory applies the positive potential Vdd to the node ND1 through the p-channel transistor 10, whereby the ferroelectric memory can easily apply the positive potential Vdd to the node ND1 in advance of data reading by controlling operations of the p-channel transistor 10.

According to the first embodiment, as hereinabove described, the ferroelectric memory can easily render the quantity of the current flowing toward the collector of the bipolar transistor 6 through the n-channel transistor 9 when reading "H" data larger than the quantity of the current flowing toward the collector of the bipolar transistor 6 through the n-channel transistor 9 when reading "L" data by controlling the n-channel transistor 9 to enter an ON-state weaker than that in the case of reading "H" data.

According to the first embodiment, as hereinabove described, the sense amplifier 4 is so connected to the node ND1 that the ferroelectric memory can easily read the data with the sense amplifier 4 on the basis of the potential of the node ND1.

According to the first embodiment, as hereinabove described, the bit line BL is so connected to the base of the bipolar transistor 6 through the n-channel transistor 8 that the ferroelectric memory can easily supply the current appearing on the bit line BL in data reading toward the base of the bipolar transistor 6 by controlling operations of the n-channel transistor 8.

The structure of the aforementioned ferroelectric memory according to the first embodiment was simulated under the following conditions:

positive potential Vdd=3.0 V
resistance R of the resistor 7=0.5 MΩ
capacitance of the capacitor 11=50 fF
negative potential Ve applied to the emitter of the bipolar transistor 6=−0.75 V
threshold voltage Vt of the n-channel transistor 9=0.698 V
Results of this simulation are now described.
According to the results of this simulation, it has been recognized that the collector current Ic of the bipolar transistor 6 reaches 0.681 mA (=681 µA) when the base current Ib of the bipolar transistor 6 is set to a stationary state of 7.79 µA. Thus, it has been recognized that the current amplification factor of the bipolar transistor 6 is as follows:

$Ic/Ib$=681 µA/7.79 µA=87.4 times

Another simulation was performed while pulse-changing the base current Ib of the bipolar transistor 6 under the aforementioned conditions. From the results of this simulation, it has been recognized that the difference between the collector potentials Vc in the cases of reading "H" data and "L" data respectively is about 70 mV when the difference between base potentials (potentials of the bit line BL) in the cases of reading "H" data and "L" data respectively is about 7 mV to 8 mV. In other words, it has been recognized that the amplification factor of the difference between the collector potentials Vc in the cases of reading "H" data and "L" data respectively is about 9 to 10 times the difference between the potentials of the bit line BL in the cases of reading "H" data and "L" data respectively.

According to this simulation performed while pulse-changing the base current Ib, it has also been recognized that the difference between the potentials Vco generated on the node ND1 in the cases of reading "H" data and "L" data respectively is about 700 mV to 800 mV. In other words, it has been recognized that the amplification factor of the difference between the potentials Vco generated on the node ND1 in the cases of reading "H" data and "L" data respectively is about 100 times the difference between the potentials of the bit line BL in the cases of reading "H" data and "L" data respectively.

Second Embodiment

Figure 6:
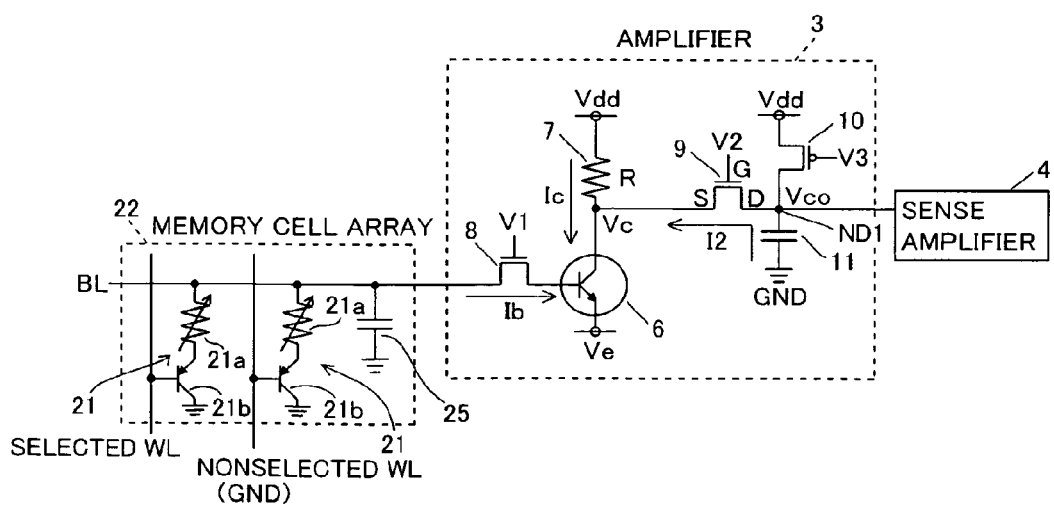
FIG. 6 is a circuit diagram showing the structure of a phase-change memory according to a second embodiment of the present invention.

Referring to FIG. 6, a second embodiment of the present invention is applied to a phase-change memory (PRAM), dissimilarly to the aforementioned first embodiment.

According to the second embodiment, each memory cell 21 forming a memory cell array 22 is constituted of a storage element 21a including a phase-change film (not shown) and a resistance element (not shown) and a bipolar transistor 21b in a structure similar to that according to the first embodiment shown in FIG. 1, as shown in FIG. 6.

When heated, the phase-change film included in the storage element 21a is partially converted to an amorphous state or a crystalline state. In the storage element 21a including the phase-change film, "H" data and "L" data are defined through the aforementioned two states (amorphous and crystalline states) of the phase-change film. The phase-change film included in the storage element 21 exhibits a high resistance when the same is in an amorphous state, and exhibits a low resistance when the same is in a crystalline state. According to the second embodiment, it is assumed that the data is "H" when the phase-change film included in the storage element 21a is in an amorphous state while the data is "L" when the phase-change film included in the storage element 21a is in a crystalline state. The resistance element included in the storage element 21a is provided in order to heat the phase-change film in data writing.

First and second terminals of the storage element 21a are connected to a bit line BL and the emitter of a bipolar transistor 21b respectively. The collector of the bipolar transistor 21b is grounded, while the base thereof is connected to a word line WL. The bit line BL has a parasitic capacitance 25.

The remaining structure of the second embodiment is similar to that of the aforementioned first embodiment.

A data read operation of the phase-change memory according to the second embodiment is now described with reference to FIGS. 6 to 8.

Figure 7:
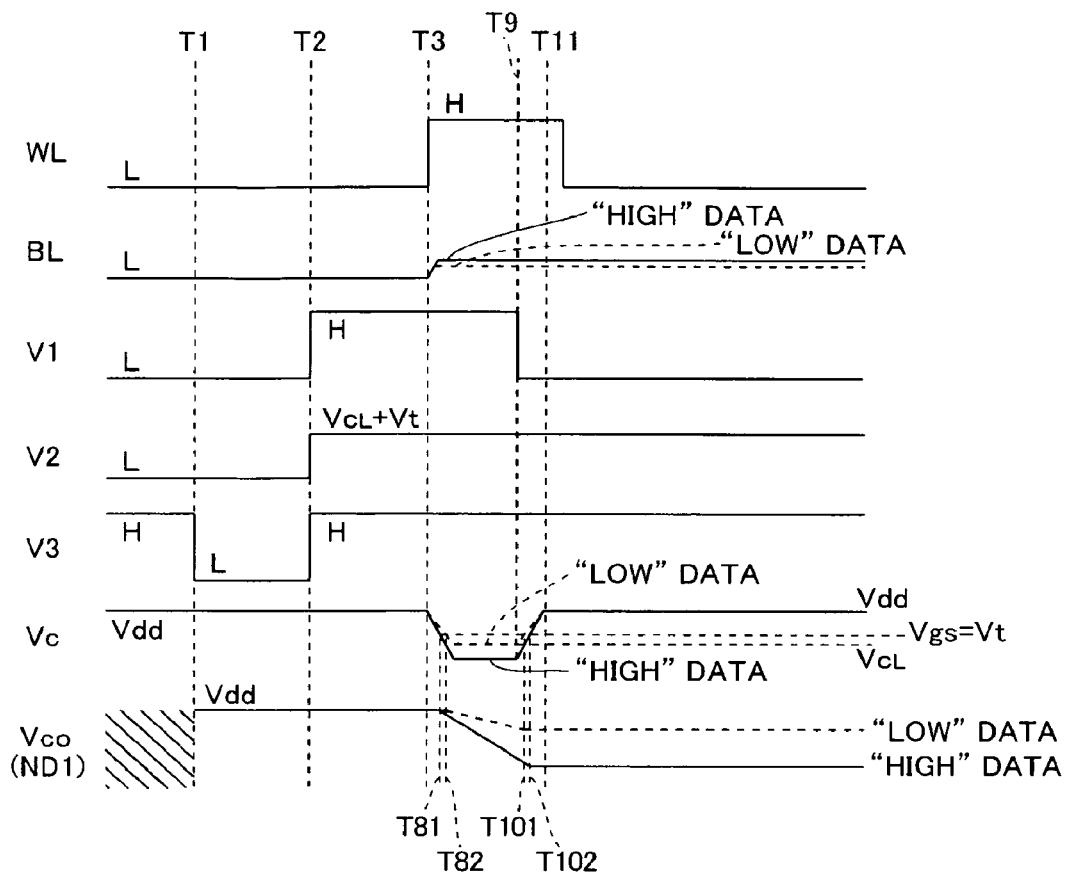
FIG. 7 is a voltage waveform diagram for illustrating a data read operation of the phase-change memory according to the second embodiment of the present invention.

At times T1 and T2 shown in FIG. 7, the phase-change memory operates similarly to the operations of the ferroelectric memory according to the first embodiment at the times T1 and T2 shown in FIG. 2.

At a time T3, the potential of a prescribed word line (selected word line) WL selected from a plurality of word lines WL of the memory cell array 22 (see FIG. 6) rises from a low level to a high level for operating the bipolar transistor 21b. The phase-change memory applies a voltage causing no state change of the phase-change film included in the storage element 21a (see FIG. 6) to the bit line BL.

When the phase-change film included in the storage element 21a is in an amorphous state exhibiting a high resistance (when the storage element 21a stores "H" data), the quantity of a current flowing toward GND through the memory cell 21 (the storage element 21a and the bipolar transistor 21b) is reduced. Thus, the quantity of a current flowing in the bit line BL is increased. When the phase-change film included in the storage element 21a is in a crystalline state exhibiting a low resistance (when the storage element 21a stores "L" data), on the other hand, the quantity of the current flowing toward GND through the memory cell 21 (the storage element 21a and the bipolar transistor 21b) is increased. Thus, the quantity of the current flowing in the bit line BL is reduced.

Figure 8:
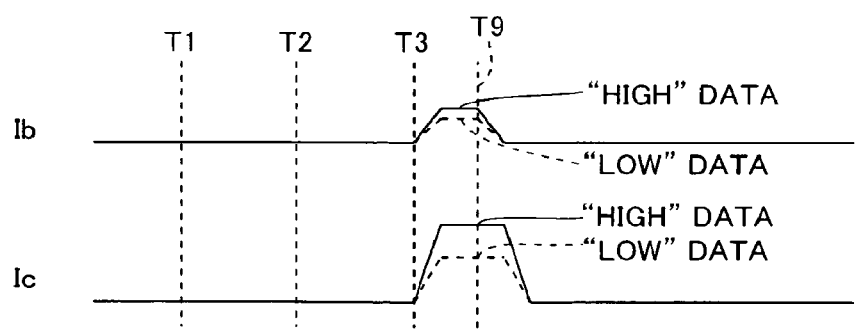
FIG. 8 is a waveform diagram showing changes of a base current Ib and a collector current Ic of a bipolar transistor in the data read operation of the phase-change memory according to the second embodiment of the present invention.

Consequently, a larger quantity of base current Ib flows when the phase-change memory reads "H" data from the memory cell 21 (see FIG. 6) as compared with a case of reading "L" data, as shown in FIG. 8. Further, the base current Ib continuously flows from the bit line BL toward the emitter of a bipolar transistor 6 through the bases of an n-channel transistor 8 and the bipolar transistor 6 while the phase-change memory holds the n-channel transistor 8 in an ON-state, as shown in FIG. 6.

When the base current Ib of the bipolar transistor 6 (see FIG. 6) starts to flow at the time T3, a collector current Ic amplified through the function of the bipolar transistor 6 transiently flows according to the second embodiment, as shown in FIG. 8. When the phase-change memory reads "H" data from the memory cell 21 (see FIG. 6), a larger quantity of collector current Ic flows as compared with the case of reading "L" data. Following this flow of the collector current Ic, the collector potential Vc of the bipolar transistor 6 goes down from Vdd as shown in FIG. 7. This collector potential Vc more remarkably goes down when the phase-change memory reads "H" data from the memory cell 21, as compared with the case of reading "L" data.

The n-channel transistor 9 (see FIG. 6) enters an ON-state when the gate-to-source voltage $V_{GS}$ (=V2−Vc) thereof reaches the threshold voltage Vt (a time T81 if the phase-change memory reads "H" data, or a time T82 if the phase-change memory reads "L" data) while the collector potential Vc goes down from Vdd. Thus, a current I2 flows from a capacitor 11 toward the collector of the bipolar transistor 6 through the n-channel transistor 9 after the time T81 or T82 (see FIG. 7), as shown in FIG. 6. Following this, the potential Vco of a node ND1 gradually goes down from Vdd, as shown in FIG. 7.

According to the second embodiment, the collector potential Vc is more remarkably reduced when the phase-change memory reads "H" data as compared with the case of reading "L" data, whereby the gate-to-source voltage $V_{GS}$ of the n-channel transistor 9 (see FIG. 6) is more increased. Thus, a larger quantity of current I2 flows through the n-channel transistor 9 when the phase-change memory reads "H" data, as compared with the case of reading "L" data. In other words, the n-channel transistor 9 enters a weak ON-state close to an OFF-state to feed only a small quantity of current when the phase-change memory reads "L" data, while the n-channel transistor 9 enters a stronger ON-state to feed a relatively large quantity of current when the phase-change memory reads "H" data. Thus, the potential Vco of the node ND1 more remarkably goes down from VDD when the phase-change memory reads "H" data, as compared with the case of reading "L" data. According to the second embodiment, therefore, the difference between the potentials generated on the node ND1 when the phase-change memory reads "H" data and "L" data respectively is larger than the difference between the collector potentials Vc of the bipolar transistor 6 (see FIG. 6) generated when the phase-change memory reads "H" data and "L" data respectively.

At a time T9, a potential V1 input in the gate of the n-channel transistor 8 (see FIG. 6) goes down from a high level to a low level, whereby the n-channel transistor 8 enters an OFF-state. Thus, the base current Ib as well as the collector current Ic are gradually reduced, as shown in FIG. 8. Following this reduction of the collector current Ic, the collector potential Vc of the bipolar transistor 6 (FIG. 6) goes up as shown in FIG. 7. The n-channel transistor 9 (see FIG. 6) enters an OFF-state after the gate-to-source voltage $V_{GS}$ (=V2−Vc) thereof reaches the threshold voltage Vt (a time T101 if the phase-change memory reads "L" data, or a time T102 if the phase-change memory reads "H" data) while the collector potential Vc goes up. Thus, no current I2 flows from the capacitor 11 toward the collector of the bipolar transistor 6 through the n-channel transistor 9 after the time T101 or T102 (see FIG. 7), as shown in FIG. 6. Therefore, the potential Vco of the node ND1 stops going down.

According to the second embodiment, the capacitor 11 holds the potential Vco of the node ND1 at the time of stopping going down (the time T101 if the phase-change memory reads "L" data, or the time T102 if the phase-change memory reads "H" data). Thereafter the quantity of the collector current Ic flowing in the bipolar transistor 6 (see FIG. 6) is further reduced before a time T11 so that the collector potential Vc goes up to Vdd, as shown in FIG. 7.

After the time T11 (see FIG. 7), a sense amplifier 4 compares the potential Vco of the node ND1 with a prescribed reference potential, as shown in FIG. 6. The reference potential is set to a level between the potentials Vco generated on the node ND1 when the phase-change memory reads "H" data and "L" data respectively. The sense amplifier 4 further amplifies the difference between the potential Vco of the node ND1 and the reference potential, and determines the data read from the memory cell 21 as "H" data or "L" data. After the time T11, further, the potential of the word line WL falls from a high level to a low level. The phase-change memory according to the second embodiment reads the data in the aforementioned manner.

According to the second embodiment, as hereinabove described, the phase-change memory is provided with the bipolar transistor 6 whose base is connected to the bit line BL for amplifying a current, corresponding to the data of the memory cell 21, appearing on the bit line BL in data reading with the bipolar transistor 6, whereby the difference between the collector currents Ic of the bipolar transistor 6 generated in data reading in correspondence to "H" data and "L" data respectively can be rendered larger than the difference between the currents (base currents Ib) appearing on the bit line BL in correspondence to "H" data and "L" data respectively. According to the second embodiment, further, a first end of a resistor 7 is connected to the collector of the bipolar transistor 6 while the phase-change memory applies positive and negative potentials Vdd and Ve to a second end of the resistor 7 and the emitter of the bipolar transistor 6 respectively, whereby the difference between the collector potentials Vc in the cases of reading "H" data and "L" data respectively can be rendered larger than the difference between the potentials of the bit line BL corresponding to "H" data and "L" data respectively.

According to the second embodiment, the source of the n-channel transistor 9 is connected to the collector of the bipolar transistor 6 while the phase-change memory more increases the gate-to-source voltage $V_{GS}$ of the n-channel transistor 9 in response to more remarkable reduction of the collector potential Vc of the bipolar transistor 6 when reading "H" data as compared with the case of reading "L" data thereby feeding a larger quantity of current I2 toward the collector of the bipolar transistor 6 through the n-channel transistor 9, whereby the potential Vco of the node ND1 linked to the drain of the n-channel transistor 9 can more remarkably go down from the positive potential Vdd when the phase-change memory reads "H" data as compared with the case of reading "L" data. Thus, the difference between the potentials Vco generated on the node ND1 when the phase-change memory reads "H" data and "L" data respectively can be rendered larger than the difference between the collector potentials Vc of the bipolar transistor 6 in the cases of reading "H" data and "L" data respectively. In other words, the phase-change memory can amplify the current, corresponding to the data of the memory cell 21, appearing on the bit line BL not only with the bipolar transistor 6 but also with the n-channel transistor 9. Thus, the phase-change memory can suppress reduction of data determination accuracy by determining the data with the sense amplifier 4 on the basis of the potential Vco of the node ND1, also when the difference between the quantities of currents resulting from different data stored in the memory cell 21 is reduced.

The remaining effects of the second embodiment are similar to those of the aforementioned first embodiment.

Third Embodiment

Figure 9:
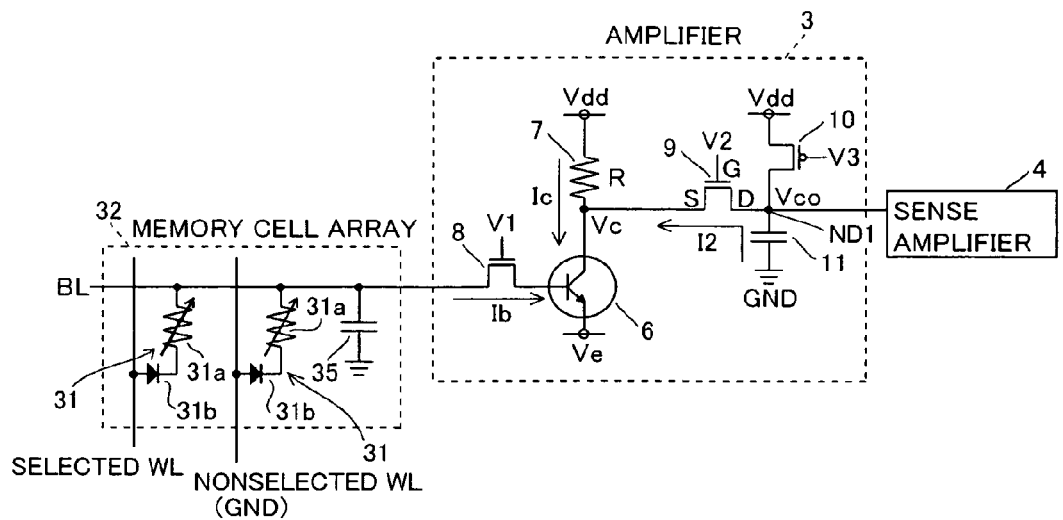
FIG. 9 is a circuit diagram showing the structure of a phase-change memory according to a third embodiment of the present invention.

Referring to FIG. 9, each memory cell 31 forming a memory cell array 32 is constituted of a storage element 31a including a phase-change film (not shown) and a resistance element (not shown) and a diode 31b in a phase-change memory according to a third embodiment of the present invention, in a structure similar to that according to the second embodiment shown in FIG. 6. According to the third embodiment, it is assumed that the data is "H" when the phase-change film included in the storage element 31a is in a crystalline state (low resistance) while the data is "L" when the phase-change film included in the storage element 31a is in an amorphous state (high resistance).

First and second terminals of the storage element 31a are connected to a bit line BL and a first terminal of the diode 31b respectively. A second terminal of the diode 31b is connected to a word line WL. The bit line BL has a parasitic capacitance 35.

The remaining structure of the third embodiment is similar to that of the aforementioned second embodiment.

A data read operation of the phase-change memory according to the third embodiment is now described with reference to FIGS. 7 to 9.

At times T1 and T2 shown in FIG. 7, the phase-change memory operates similarly to the operations of the ferroelectric memory according to the first embodiment at the times T1 and T2 shown in FIG. 2.

At a time T3, the potential of a prescribed word line (selected word line) WL selected from a plurality of word lines WL of the memory cell array 32 (see FIG. 9) rises from a low level to a high level causing no state change of the phase-change film included in the storage element 31a. The phase-change memory holds the bit line BL in a floating state.

When the phase-change film included in the storage element 31a is in a crystalline state exhibiting a low resistance (when the storage element 31a stores "H" data), the quantity of a current flowing from the word line WL to the bit line BL through the memory cell 31 (the diode 31b and the storage element 31a) is increased, as shown in FIG. 9. When the phase-change film included in the storage element 31a is in an amorphous state exhibiting a high resistance (when the storage element 31a stores "L" data), on the other hand, the quantity of the current flowing from the word line WL to the bit line BL through the memory cell 31 (the diode 31b and the storage element 31a) is reduced.

Consequently, a larger quantity of base current Ib flows when the phase-change memory reads "H" data from the memory cell 31 (see FIG. 9) as compared with a case of reading "L" data, as shown in FIG. 8. Further, the base current Ib continuously flows from the bit line BL toward the emitter of a bipolar transistor 6 through the bases of an n-channel transistor 8 and the bipolar transistor 6 while the phase-change memory holds the n-channel transistor 8 in an ON-state, as shown in FIG. 9.

In a period after the time T3, the phase-change memory operates similarly to the phase-change memory according to the aforementioned second embodiment in the period after the time T3.

According to the third embodiment, the phase-change memory can attain effects such as suppression of reduction of data determination accuracy also when the difference between the quantities of currents resulting from different data stored in the memory cell 31 is reduced similarly to the aforementioned second embodiment, due to the aforementioned structure.

Fourth Embodiment

Figure 10:
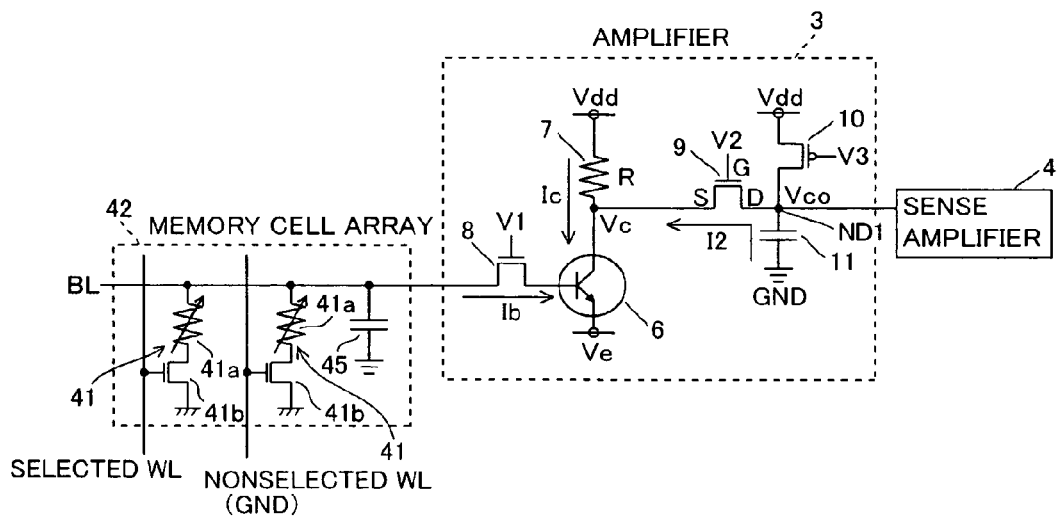
FIG. 10 is a circuit diagram showing the structure of a resistance-change memory according to a fourth embodiment of the present invention.

Referring to FIG. 10, a fourth embodiment of the present invention is applied to a resistance-change memory (RRAM), dissimilarly to the aforementioned first to third embodiments.

According to the fourth embodiment, each memory cell 41 forming a memory cell array 42 is constituted of a storage element 41a including a CMR (colossal magnetoresistive) film (not shown) and an n-channel transistor 41b in a structure similar to that according to the first embodiment shown in FIG. 1, as shown in FIG. 10.

The resistance value of the CMR film included in the storage element 41a is changed when receiving a voltage pulse. In the storage element 41a including the CMR film, "H" data and "L" data are defined through the change of the CMR film between high- and low-resistance states. According to the fourth embodiment, it is assumed that the data is "H" when the CMR film included in the storage element 41a is in a high-resistance state while the data is "L" when the CMR film included in the storage element 41a is in a low-resistance state.

First and second terminals of the storage element 41a are connected to a bit line BL and either the source or the drain of the n-channel transistor 41b. Either the drain or the source of the n-channel transistor 41b is grounded, and the gate thereof is connected to a word line WL. The bit line BL has a parasitic capacitance 45.

The remaining structure of the fourth embodiment is similar to that of the aforementioned first embodiment.

A data read operation of the resistance-change memory according to the fourth embodiment is now described with reference to FIGS. 7, 8 and 10.

At times T1 and T2 shown in FIG. 7, the resistance-change memory operates similarly to the operations of the ferroelectric memory according to the first embodiment at the times T1 and T2 shown in FIG. 2.

At a time T3, the potential of a prescribed word line (selected word line) WL selected from a plurality of word lines WL of the memory cell array 42 (see FIG. 10) rises from a low level to a high level for operating the n-channel transistor 41b. The resistance-change memory applies a voltage causing no state change of the CMR film included in the storage element 41a to the bit line BL.

When the CMR film included in the storage element 41a is in a high-resistance state (when the storage element 41a stores "H" data), the quantity of a current flowing toward GND through the memory cell 41 (the storage element 41a and the n-channel transistor 41b) is reduced, as shown in FIG. 10. Thus, the quantity of a current flowing in the bit line BL is increased. When the CMR film included in the storage element 41a is in a low-resistance state (when the storage element 41a stores "L" data), on the other hand, the quantity of the current flowing toward GND through the memory cell 41 (the storage element 41a and the n-channel transistor 41b) is increased. Thus, the quantity of the current flowing in the bit line BL is reduced.

Consequently, a larger quantity of base current Ib flows when the resistance-change memory reads "H" data from the memory cell 41 (see FIG. 10) as compared with a case of reading "L" data, as shown in FIG. 8. Further, the base current Ib continuously flows from the bit line BL toward the emitter of a bipolar transistor 6 through the bases of an n-channel transistor 8 and the bipolar transistor 6 while the resistance-change memory holds the n-channel transistor 8 in an ON-state, as shown in FIG. 10.

In a period after the time T3, the resistance-change memory operates similarly to the phase-change memory according to the aforementioned second embodiment in the period after the time T3.

According to the fourth embodiment, the resistance-change memory can attain effects such as suppression of reduction of data determination accuracy also when the difference between the quantities of currents resulting from different data stored in the memory cell 41 is reduced similarly to the aforementioned second embodiment applying the present invention to a phase-change memory, due to the aforementioned structure.

Although the present invention has been described and illustrated in detail, it is clearly understood that the same is by way of illustration and example only and is not to be taken by way of limitation, the spirit and scope of the present invention being limited only by the terms of the appended claims.

For example, while the above first to fourth embodiments have been described with reference to a ferroelectric memory, phase-change memories and a resistance-change memory as exemplary memories to which the present invention is applied respectively, the present invention is not restricted to this but is also applicable to various memories other than the ferroelectric, phase-change and resistance-change memories.

While the current I2 flows toward the collector of the bipolar transistor 6 through the n-channel transistor 9 in both of the cases of reading "H" data and "L" data in a data reading period in each of the aforementioned first to fourth embodiments, the present invention is not restricted to this but no current I2 may flow toward the collector of the bipolar transistor 6 through the n-channel transistor 9 in the case of reading "L" data in the data reading period. According to this structure, the difference between the potentials Vco of the node ND1 in the cases of reading "H" data and "L" data respectively can be more increased since the potential Vco of the node ND1 does not go down from Vdd in the data reading period.

What is claimed is:
1. An apparatus, comprising:
  a memory cell coupled to a bit line and configured to hold data, wherein the data includes first data or second data;
  a first transistor having at least a base, wherein the first transistor is configured to read the data by amplifying a current corresponding to the data that appears on the bit line if the data is read; and
  a second transistor having at least a first terminal, a second terminal, a third terminal, and a channel between the second and third terminals, wherein the second transistor is configured to feed different quantities of currents to the base of the first transistor through the channel, in response to reading the first data or the second data, by changing a potential difference between a first terminal of the second transistor and either a second terminal or a third terminal of the second transistor;

wherein the first transistor has a collector coupled to a first end of a third transistor, and wherein a second end of the third transistor is coupled to a sense amplifier.

2. The apparatus of claim 1, wherein the first transistor comprises a bipolar transistor, and wherein the second transistor comprises a field-effect transistor.

3. The apparatus of claim 1, wherein the memory cell comprises a ferroelectric memory cell.

4. The apparatus of claim 1, wherein the memory cell comprises a phase-change memory cell.

5. The apparatus of claim 1, wherein the memory cell comprises a resistance-change memory cell.

6. An apparatus, comprising:
   a memory cell coupled to a bit line and configured to hold data; and
   a first transistor having a control terminal selectively coupleable to the bit line, wherein the first transistor is configured to read the data by amplifying a current corresponding to the data that appears on the bit line if the data is read;
   wherein a second terminal of the first transistor is coupled to a first end of a second transistor, and wherein a second end of the second transistor is coupled to a sense amplifier.

7. The apparatus of claim 6, further comprising a resistor having a resistance larger than an interconnection resistance and having a first end coupled to the second terminal of the first transistor, wherein a second end of the resistor is configured to receive a positive potential while a negative potential is applied to a third terminal of the first transistor.

8. The apparatus of claim 6, wherein the first transistor comprises a bipolar transistor, and wherein the second transistor comprises a field-effect transistor.

9. The apparatus of claim 6, wherein the memory cell comprises a ferroelectric memory cell.

10. The apparatus of claim 6, wherein the memory cell comprises a phase-change memory cell.

11. The apparatus of claim 6, wherein the memory cell comprises a resistance-change memory cell.

12. An apparatus, comprising:
    a memory cell coupled to a bit line and configured to hold data, wherein the data includes first data or second data; and
    an amplification circuit comprising a bipolar transistor having a base coupled to the bit line and configured to receive an input current corresponding to the data that appears on the bit line if the data held in the memory cell is read, wherein the amplification circuit is further configured to apply the input current and to generate an output current having a first magnitude if the first data is read or a second magnitude if the second data is read.

13. The apparatus of claim 12, wherein a second terminal of the bipolar transistor is configured to provide the output current.

14. The apparatus of claim 13, wherein the second terminal of the bipolar transistor comprises a collector.

15. The apparatus of claim 13, wherein a difference between the first and second magnitudes is greater than a difference between currents appearing on the bit line if reading the first data or the second data.

16. The apparatus of claim 13, wherein the memory cell comprises a ferroelectric memory cell.

17. The apparatus of claim 13, wherein the memory cell comprises a phase-change memory cell.

18. The apparatus of claim 13, wherein the memory cell comprises a resistance-change memory cell.

19. The apparatus of claim 13, wherein the memory cell comprises a memory cell of a random access memory (RAM).

20. The apparatus of claim 12, wherein the base of the bipolar transistor is coupled to the bit line through a field-effect transistor.

21. The apparatus of claim 6, wherein the control terminal of the first transistor is selectively coupleable to the bit line through a third transistor.

* * * * *

UNITED STATES PATENT AND TRADEMARK OFFICE
CERTIFICATE OF CORRECTION

Page 1 of 1

PATENT NO. : 7,933,148 B2
APPLICATION NO. : 12/562724
DATED : April 26, 2011
INVENTOR(S) : Murayama et al.

It is certified that error appears in the above-identified patent and that said Letters Patent is hereby corrected as shown below:

Column 20, line 7, in Claim 12, delete "comprising" and insert -- including --.

Signed and Sealed this
Eighteenth Day of October, 2011

David J. Kappos
*Director of the United States Patent and Trademark Office*